United States Patent
Ikeda

(10) Patent No.: US 7,059,928 B2
(45) Date of Patent: Jun. 13, 2006

(54) LIGHT EMITTING ELEMENT AND METHOD FOR MANUFACTURING THE SAME

(75) Inventor: Hisao Ikeda, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/753,384

(22) Filed: Jan. 9, 2004

(65) Prior Publication Data

US 2004/0229080 A1    Nov. 18, 2004

(30) Foreign Application Priority Data

Jan. 10, 2003  (JP) .............................. 2003-004910

(51) Int. Cl.
  *H04J 9/00*   (2006.01)
  *H04J 9/24*   (2006.01)

(52) U.S. Cl. .......................................... 445/24; 445/16

(58) Field of Classification Search ........ 313/498–511; 445/26, 25, 24, 16; 427/66; 428/690, 917
See application file for complete search history.

(56) References Cited

U.S. PATENT DOCUMENTS

| | | | |
|---|---|---|---|
| 5,989,737 A |  | 11/1999 | Xie et al. |
| 6,132,280 A | * | 10/2000 | Tanabe et al. ............... 445/58 |
| 6,166,488 A | * | 12/2000 | Arai ............................ 313/504 |
| 6,293,843 B1 |  | 9/2001 | Toya et al. .................... 445/25 |
| 6,486,601 B1 | * | 11/2002 | Sakai et al. ................. 313/504 |
| 2001/0043043 A1 | * | 11/2001 | Aoyama et al. ............ 313/506 |
| 2002/0057055 A1 | * | 5/2002 | Yamazaki et al. .......... 313/506 |
| 2002/0187567 A1 | * | 12/2002 | Yamazaki et al. ............ 438/29 |
| 2003/0117069 A1 |  | 6/2003 | Kato et al. |
| 2003/0129447 A1 |  | 7/2003 | Madathil et al. |
| 2004/0164669 A1 | * | 8/2004 | Kawaguchi et al. ........ 313/501 |

FOREIGN PATENT DOCUMENTS

| | | |
|---|---|---|
| EP | 0 773 707 A2 | 5/1997 |
| EP | 1296386 | 3/2003 |
| JP | 07-045367 | 2/1995 |
| JP | 10-255985 | 9/1998 |
| JP | 2000-012237 | 1/2000 |
| JP | 2000-068068 | 3/2000 |
| JP | 2000-164355 | 6/2000 |
| JP | 2000-252077 | 9/2000 |

(Continued)

OTHER PUBLICATIONS

International Search Report Dated Mar. 2, 2004 From PCT/JP03/16373.

(Continued)

*Primary Examiner*—Joseph Williams
*Assistant Examiner*—Peter Macchiarolo
(74) *Attorney, Agent, or Firm*—Nixon Peabody LLP; Jeffrey L. Costellia

(57) ABSTRACT

In order to provide a light emitting device and an electronic equipment which suppress luminance deterioration, and have long life, the invention does not form an organic compound layer which is composed of a hole injection layer, a hole transport layer, a light emitting layer, an electron transport layer, an electron injection layer and so on, and electrodes in vacuum-through, as in a conventional vacuum deposition method, but after a hole injection layer, which comprises phthalocyanine, is formed, it is exposed to gas atmosphere. In particular, copper phthalocyanine is exposed to oxygen atmosphere. By this method, provided is an organic light emitting element which has long life, and by using the above-described organic light emitting element, a light emitting device and an electronic equipment are fabricated.

7 Claims, 8 Drawing Sheets

FOREIGN PATENT DOCUMENTS

| | | |
|---|---|---|
| JP | 2001-052871 | 2/2001 |
| JP | 2001-284059 | 10/2001 |
| JP | 2003-109770 | 4/2003 |

OTHER PUBLICATIONS

C.W. Tang and S.A. VanSlyke, "Organic electroluminescent diodes", Applied Physics Letter, vol. 51, No. 12, pp. 913-915, Sep. 21, 1987.

S.A. Van Slyke, C.H. Chen and C.W. Tang, "Organic electroluminescent devices with improved stability", Applied Physics Letter, vol. 69, No. 15, pp. 2160-2162, Oct. 7, 1996.

Search Report and Written Opinion (Application No. PCT/JP2004/010187; PCT7268) Dated: Sep. 7, 2004 with translation of Search Report and Written Opinion.

Nakanishi et al., "*Doping Effect and Conduction Mechanism of Organic Semiconductor Evaporated Films*", Technical Report of IEICE . . . , OME2000-108 (Sep. 2000) with Full Translation.

Tsuchiya et al., "*Manufacturing Method of Light Emitting Element*", U.S. Appl. No. 10/894,346, filed: Jul. 20, 2004 (Specification, Claims, Drawings and Filing Receipt).

* cited by examiner

LIGHT EMITTING ELEMENT AND METHOD FOR MANUFACTURING THE SAME

TECHNICAL FIELD

This invention relates to a manufacturing method of a light emitting element which can obtain fluorescence or phosphorescence, by applying an electric field to such an element that a film including an organic compound (hereinafter, inscribed as "organic compound layer"), is disposed between a pair of electrodes.

BACKGROUND OF THE INVENTION

A light emitting element is a element which emits light by applying an electric field. As to its light emission mechanism, it is said that by applying a voltage to electrodes, and interposing an organic compound layer therebetween, electrons which are injected from a cathode and holes which are injected from an anode, are recombined at a light emission center in an organic compound layer to form molecules which are in an excitation state (hereinafter, inscribed as "molecular exciter"), and the molecular exciter discharges energy to emit light on the occasion of returning to a ground state.

As types of molecular exciters that are organic compound form, a singlet excitation state and a triplet excitation state are possible, and in this specification, included are both cases in which either excitation state contributes to light emission.

In such light emitting element, normally, an organic compound layer is formed by a thin film with the thickness even less than 1 μm. Also, since the light emitting element is an element of a self-light emission type in which the organic compound layer itself emits light, there is also no necessity of a back light as used in a conventional liquid crystal display. Therefore, it is a big advantage that it is possible to fabricate a light emitting element of extremely a thin shape and lightness in weight.

Also, for example, in an organic compound layer of approximately 100–200 nm, time from carrier injection until recombination is approximately tens of nano seconds, considering carrier mobility of the organic compound layer. Light emission is realized with time within a micro second order, even if a process from recombination of carrier until light emission is included. Therefore, it is also one feature that a response speed is very fast.

Further, since the light emitting element is a light emitting element of a carrier injection type, driving by a direct-current voltage is possible, and generation of noise is reduced. With regard to a drive voltage, firstly, the organic compound layer is made to be a uniform ultra thin film with a thickness of approximately 100 nm. An electrode material is selected which lessens a carrier injection barrier to the organic compound layer, and furthermore, a single hetero-structure (2 layer structure) is introduced, and thereby, achieved sufficient luminance of 100 $cd/m^2$ at 5.5V. (See C. W. Tang et al., Applied Physics Letters, Vol. 51, No. 12, 913–915 (1987)).

From characteristics such as a thin shape and lightness in weight/high speed response/direct-current low voltage drive etc., the light emitting element is noticed as a next-generation flat panel display element. Also, since it is of a self-light emission type and a viewing field angle is wide, its visibility is relatively good, and it is considered to be effective as a element which can be used for a display screen of a portable equipment.

In the meantime, as a big problem of such light emitting element, reliability of an element is pointed out. Among reliability, in particular, deterioration over time of luminance is significant, and big improvement is necessary.

The deterioration over time of luminance is considered to be basically a phenomenon derived from a material which is used, but it is possible to lengthen a half-life period of luminance by a element structure and a driving method. For example, there is such an example that, as a hole injection layer, copper phthalocyanine (hereinafter, inscribed as "CuPc") is inserted, and further, drive is carried out by an alternate current (constant current in case of forward bias, and constant voltage in case of reverse bias) of a rectangular wave but not by a direct current, the half-life period of luminance was largely improved. (See S. A. Van Slyke et al., Applied Physics Letters, Vol. 69, No. 15, 2160–2162 (1996)).

In Van Slyke et al., lengthening a luminance half-life period up to 4000 hours at initial luminance 510 $cd/m^2$ was successfully attained. As its cause, cited are elimination of accumulation of space electrification by alternate-current drive, goodness of heat resistance of N,N'-di(naphthalene-1-yl)-N,N'-diphenyl-benzidene (hereinafter, inscribed as "NPB") which is a hole transport layer, and that CuPc, which is a hole injection layer, has an excellent hole injection property.

Also, if surface treatment is applied to indium-tin-oxide (hereinafter, inscribed as "ITO") which is used for an anode, a contact angle with water becomes almost 0°. A contact angle of NPB with water is approximately 70°–80°, and it is understandable that a difference of surface energies between ITO and NPB is very large. On this account, when a film of NPB is formed directly on ITO, NPB is easily crystallized, and deteriorated faster as an element. Inserting CuPc into a boundary face of ITO and NPB as a hole injection layer to suppress crystallization of NPB is also a cause which lengthened reliability.

As described above, by using CuPc for a hole injection layer, reliability of a light emitting element is improved, but it cannot be said that reliability is sufficient. As one of its reasons, it is pointed out that a film forming property is bad, and it is hard to prepare a uniform thin film.

SUMMARY OF THE INVENTION

In this connection, the problem addressed by the invention is suppressing deterioration of luminance over time and lengthening an element life in a light emitting element which used phthalocyanines, for instance, CuPc, for a hole injection layer.

Also, a problem addressed is in providing a light emitting device with excellent endurance by using a light emitting element that the invention discloses. Further, a problem addressed is in providing an electronic equipment with excellent endurance, by using the such a light emitting device.

The invention is, in a manufacturing method of a light emitting element which has an anode, a cathode, a light emitting layer which is disposed between the anode and the cathode, and a hole injection layer which is disposed between the anode and the cathode, characterized in that the hole injection layer is formed by phthalocyanine such as CuPc, and after film formation of the hole injection layer, it is exposed to gas atmosphere.

By exposing the hole injection layer which used phthalocyanine to specific gas atmosphere after film formation, it is possible to obtain higher reliability than an element which is fabricated by a conventional vacuum-through film forming method. This inventor considers that it may be true that film quality of phthalocyanine is improved by being exposed to gas atmosphere so that reliability is heightened.

Also, the invention is a light emitting element which is characterized by including an electron acceptable compound as a dopant having such a nature that it is capable of oxidizing phthalocyanine in the hole injection layer. By using the hole injection layer in which the electron acceptable compound is doped, lowering of a drive voltage of an element becomes possible.

Also in the invention, it is preferable that electron acceptable gas such as oxygen is used as the above-described gas. By exposing the hole injection layer to electron acceptable gas atmosphere, lowering of a drive voltage of an element becomes possible.

Also, the invention is, in a light emitting element which has at least an anode, a cathode, a light emitting layer which is disposed between the anode and the cathode, and a hole injection layer which is disposed between the anode and the cathode. The above-described hole injection layer is formed by phthalocyanine, and a light emitting device includes the light emitting element fabricated through a process of exposing to gas atmosphere after film formation of the hole injection layer. Also, the invention is characterized in that an electronic device includes the light emitting device.

By carrying out the invention, it is possible to fabricate a light emitting element which alleviates deterioration of luminance. Also, by using the such improved light emitting element, it is possible to provide a light emitting device in which deterioration of luminance is small. Further, by fabricating an electronic equipment by using the above-described light emitting device, it is possible to provide an electronic equipment which lasts for a longer time than in the prior art.

DETAILED DESCRIPTION

Figure 1:
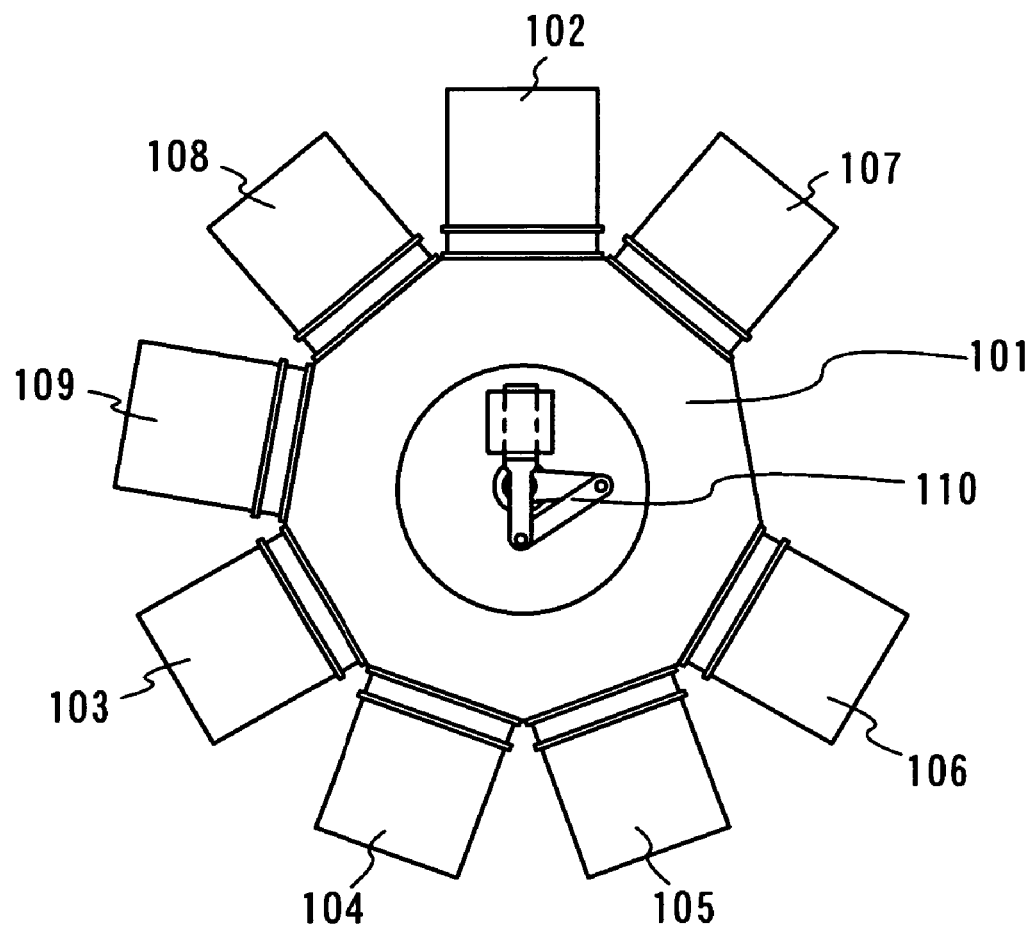
FIG. 1 is a view showing a manufacturing device which is used to fabricate a light emitting element of the invention.

Hereinafter, a mode for carrying out the invention will be described in detail with reference to the drawings. As to a light emitting element, it is sufficient that at least one of a first electrode and a second electrode is transparent, in order to take out light emission. Generally, in such an element structure, a transparent first electrode (anode) is formed over a substrate, and light is taken out from the first electrode (anode). In fact, applicable are such a structure that a first electrode is inversely made to be a cathode and light is taken out from the cathode, and such a structure that light is taken out from an opposite side to the substrate.

Speaking about a light emitting element which is applicable to the invention, anything may be used if there are at least a light emitting layer and a hole injection layer which used phthalocyanine, between the first electrode and the second electrode. Also as to a light emission color, anything may be used. In case of fabricating a full-color display element, and so on, a method of combining light's three primary colors (blue, red, green), a method of combining a color filter with a white color light emitting element, a method of combining a color conversion layer with a blue color light emitting element, and so on, have been known.

Also, the hole injection layer may be such a film in which phthalocyanine is used as a host and to which electron acceptable compound (e.g., TCNQ-F4 and $V_2O_5$ etc.) having such a nature capable of oxidizing phthalocyanine is doped. A light emitting element using a hole injection layer in which an electron acceptable compound is doped, since a drive voltage is low, it is possible to take out light emission at a lower voltage, which is useful. Also, since such a fact that a drive voltage is low means it is possible to reduce a stress which is applied to an element, it is possible to further expect an advantage of life improvement, by combination with the invention.

In the hole injection layer in which the electron acceptable compound is doped, hole mobility is heightened, and it becomes possible to make a film of a light emitting element thicker. By realizing a thicker film, it becomes hard to short-circuit, and it is expected that a yield ratio at the time of making a element becomes better. However, CuPc has such a nature that it is easily crystallized when it is made as a thick film. As described above, if improvement of reliability by exposing to gas atmosphere is caused by such a fact that film quality becomes better, we are of the thought that it may be true that crystallization is suppressed by expose to oxygen atmosphere even if CuPc is made as a thick film.

Next, speaking about gas to which a substrate is exposed after a hold injection layer is formed as a film, electron acceptable gas such as oxygen is preferable. The reason is that it is possible to expect lowering of a drive voltage in the same manner as the above-described dopant.

A light emitting device may be fabricated by using a light emitting element of the invention. As the light emitting device, there are various applications such as illumination by utilizing a simple sheet shaped light emission, and a display device in which pixels are disposed in a matrix shape.

[Embodiment 1]

In this embodiment, a process of making a light emitting element in accordance with the invention is disclosed, and a manufacturing device of a multi-chamber system which is used is described. This manufacturing device can carry out sealing processing by uniting with an opposing substrate, which is cast in separately from a substrate, after the substrate is cast in, and processing of film formation etc. is carried out continuously.

A light emitting element manufacturing device shown in FIG. 1 has a transport chamber 101 (a substrate and an opposing substrate, a transport robot 110 for transporting a metal mask are attached), a substrate/mask stock chamber 102 which is coupled to the transport chamber through a gate valve, a preprocessing chamber 103, an organic deposition chamber 1 104, an organic deposition chamber 2 105, a metal deposition chamber 106, a CVD chamber 107, a sealing glass stock chamber 108, and a sealing chamber 109.

In the first place, cast-in of a substrate and a metal mask for deposition is carried out in the substrate/mask stock chamber 102. The substrate/mask stock chamber is made to be of an elevator structure (in this embodiment, assumed to be of 11 stages). Each stage of the elevator structure is made to be a dual purpose of a substrate (in this embodiment, assumed to be of 126.6 mm×126.6 mm) or a mask. It is possible to accommodate maximum 10 sheets in total for both of the substrate and the mask. Since a remaining 1 stage is made to be a substrate heating state for heading the substrate, it is made to be an empty stage at the time of cast-in. In this manufacturing device, a direction of the substrate is always face-down.

Next, cast-in of the opposing substrate is carried out in the sealing glass stock chamber 108. The sealing glass stock chamber is made to be of an elevator structure (in this embodiment, assumed to be 10 stages). Each stage accommodates maximum 10 sheets of opposing substrate (in this embodiment, assumed to be of 126.6 mm×126.6 mm) for which preprocessing (representatively, point to drying agent pasting for absorbing moisture inside and outside a panel, and seal agent application for gluing together with the substrate) is finished. In this manufacturing device, a direction of the opposing substrate is always face-up.

In this manufacturing device, to all substrates which are cast in, film forming processing is finished in advance. This is called as a "deposition mode". After this deposition mode is finished, it is entered into a "sealing mode" in which gluing together with the opposing substrate is carried out.

Hereinafter, taking a case of using 7 sheets of substrates and 3 sheets of masks as an example, the deposition mode will be described.

Firstly, it is assumed that the transport chamber 101, the preprocessing chamber 103, the organic deposition chamber 104, the organic deposition chamber 105, the metal deposition chamber 106, and the CVD chamber 107 have been exhausted in high vacuum up to $10^{-5}10^{-6}$ Pa in advance. During a period of the deposition mode, the transport chamber is always held in high vacuum. Also, it is assumed that deposition materials, which are set in the organic deposition chamber 104 and the organic deposition chamber 105, have been pre-heated at 30° C. lower temperature than each deposition start temperature to each material. Preferably, this pre-heat time is 12 hours or more, and it aims to remove moisture which is attached to the deposition material. Next, after exhausting the substrate/mask stock chamber 102, a mask is transported to the organic deposition chamber, the organic deposition chamber, and the metal deposition chamber. In this manufacturing device, these three are film forming chambers which use a mask. When the above-described preparation is completed, the substrate is transported to the preprocessing chamber. In the preprocessing chamber, substrate heating in vacuum by a lamp heater, and plasma processing by use of a gas system (e.g., O2 plasma processing) are possible, and either processing is carried out to an entire surface of the substrate.

With regard to substrate heating, since it is possible to carry out also in the stage of substrate heating in the substrate/mask stock chamber 102, it may be carried out here in order to realize throughput improvement. In this embodiment, it is assumed that substrate heating in vacuum by a lamp heater is carried out in the substrate/mask stock chamber after exhaustion. That is, the substrate is transported from the substrate/mask stock chamber through the transport chamber 101 to the substrate heating stage of the substrate/mask stock chamber, and heater heating is carried out for 30 minutes at substrate actual temperature 150° C. After finishing the heating, the substrate heating stage is held off from the lamp heater, and thereby substrate cooling is carried out for 30 minutes. After finishing the heating, the substrate is carried through the transport chamber to the preprocessing chamber 103, and cooling is carried out (i.e., held in standby in the preprocessing chamber). Thus, it becomes possible to vacuum-heat a next substrate in the substrate/mask stock chamber also during a period of cooling the substrate, which is useful for throughput improvement.

Next, the substrate is transported from the preprocessing chamber 103 through the transport chamber 101 to the organic deposition chamber 105. After alignment processing, which used a mask and two units of CCD cameras is finished, a hole injection layer CuPc is formed by 20 nm, with a rate of 0.1 nm/sec. In the organic deposition chamber, a material is evaporated from a fixed deposition source (in this embodiment, assumed to be six places), and a film is formed on the upper substrate. The substrate is rotated during a period of deposition. In this manner, an in-plane distribution of a film thickness which is formed on the substrate is improved. Also, by a co-deposition method in which a plurality of materials are evaporated simultaneously from a plurality of deposition sources, it is possible to form a layer in which a substance, which becomes a guest, is doped in a substance which becomes a host.

Next, the substrate is transported through the transport chamber 101 to the CVD chamber 107. Until such time that the substrate is transported to the CVD chamber, the CVD chamber is exhausted in high vacuum up to $10^{-5}10^{-6}$ Pa. After the transportation, oxygen gas of high purity is supplied to the CVD chamber at 500 sccm. Also during a period of supplying oxygen gas, the CVD chamber is exhausted by a turbo booster pump, and therefore, pressure in the CVD chamber is constant. After the substrate is exposed in slight pressured oxygen atmosphere for 5 minutes, supply of oxygen gas is stopped, and the CVD chamber is exhausted in high vacuum.

In the CVD chamber 107, it is possible to form a CVD film on an entire surface of the substrate. A plasma processing may be carried out using a plurality types of gases. By utilizing this, for example, a silicon nitride film may be formed on a cathode Al as a protective film, and as preprocessing to the substrate, plasma processing which used a plurality types of gases (e.g., $Ar+O_2$ plasma processing) may be carried out.

Next, the substrate is transported again to the organic deposition chamber 105 through the transport chamber 101. After finishing the alignment processing, a hole transport layer NPB is formed by 60 nm at 0.2 nm/sec.

Next, the substrate is transported to the organic deposition chamber 104 through the transport chamber 101. Except for such a fact that the number of deposition sources is eight places, other mechanisms and a film forming processing method are completely the same as those in the organic deposition chamber 105. Here, a tris(8-quinolinol)aluminum complex (hereinafter, inscribed as "Alq3"), which is used as both of a light emitting layer and an electron transport layer, is formed as a film of 75 nm at 0.1 nm/sec. In particular, in a light emitting layer which is formed in the first half period of film formation, its film thickness is 37.5 nm, and dimethyl-quinacridone (hereinafter, inscribed as "DMQA") is doped with a slight amount, approximately 0.3 wt %, by the co-deposition method. By this doping, panel life in a finished panel is improved to a large extent. Also, switching from a light emitting layer to an electron transport layer is carried out smoothly by simply closing a deposition source shutter which is attached to a DMQA deposition source.

Next, the substrate is transported to the metal deposition chamber 106 through the transport chamber 101. Here, as a cathode, $CaF_2$ is formed as a film of 1 nm at 0.1 nm/sec, and Al is formed as a film of 200 nm at 1 nm/sec. In the metal deposition chamber, film formation is possible by a resistance heating (RE) method (there exist 12 points in total of 6 point type X 2 as a RE deposition source) and an EB method (there exist 6 points in total of 6 point type X 1 as an EB deposition source). However, but considering damage to TFTs on the substrate, use of the resistance heating method is desirable. Mechanisms other than the deposition source and a film forming method are completely the same as those in the organic deposition chamber 104 and the organic deposition chamber 105.

The substrate, for which necessary processing is finished as described above, is returned again to the substrate/mask stock chamber 102 which is a point of departure, through the transport chamber 101. The foregoing showed a series of processing necessary for obtaining a single color panel of green color light emission, but is of non-limiting in particular.

When the similar processing is completed to all substrates which are cast in, and masks are collected from each deposition chambers to the substrate/mask stock chamber 102, the deposition mode is finished, and this manufacturing device enters into the sealing mode continuously.

The foregoing describes only a case of "mask exchange absence mode" in which three masks to be used are disposed in the deposition chamber in advance and are not exchanged during a period of deposition processing. But according to an element structure, such a request that a plurality of masks are intended to be used per one chamber of the deposition chamber comes out as a matter of course. Even in such a case, this manufacturing device is applicable, and it is sufficient that three sheets or more of necessary masks have been set in the substrate/mask stock chamber in advance, and mask exchange is carried out in an interval of processing in the deposition chamber. On a specification, this mode is called as "mask exchange presence mode" and is distinguished. In this regard, however, as masks used are increased, the number of substrates which can be flowed simultaneously is decreased as a matter of course.

Hereinafter, the sealing mode will be described.

Firstly, there is a necessity to vent the transport chamber 101, the substrate/mask stock chamber 102, and the sealing glass stock chamber 108. With regard to the transport chamber and the substrate/mask stock chamber, right after finishing the deposition mode, vent processing may be carried out. Also, with regard to the sealing glass stock chamber, by carrying out setting of an opposing substrate for which preprocessing is finished (preferably right before sealing), it is possible to suppress deterioration of a seal agent and a dry agent. After the setting, by carrying out exhaustion and vent processing of the sealing glass stock chamber a plurality of times (in this embodiment assumed to be two times), it is possible not only to prevent lowering of moisture density in the transport chamber at the time of the sealing mode, but also to carry out defoaming of the seal agent which is applied to the opposing substrate. It is ideal to carry out the sealing processing right after finishing the final vent processing of the sealing glass stock chamber. This is enabled by such a fact that a worker sets successively timing of each processing of vent processing of the transport chamber and the substrate/mask stock chamber, cast-in of the opposing substrate into the sealing glass stock chamber, and further, vent processing of the sealing glass stock chamber.

Next, the substrate is transported from the substrate/mask stock chamber 102, and the opposing substrate is transported from the sealing glass stock chamber 108, to the sealing chamber 109, respectively, through the transport chamber 101, respectively. In the sealing chamber, after end parts of the substrates are brought together and mecha-alignment processing of the substrate/opposing substrate is finished, the substrate/opposing substrate are glued together, and pressed, and thereby, sealing is carried out. Further, UV irradiation is carried out from an opposing substrate side (lower side), and a seal agent (in this embodiment, assumed to be UV cured resin) is cured. On this occasion, it is possible to selectively apply the UV irradiation only to a portion of the seal agent, by using a light shielding mask. In this embodiment, the light shielding mask is such a thing that a Cr film is formed over quartz glass, and it is impossible to transport it by a transport robot in the transport chamber. Therefore, it is assumed that a worker carries out the setting directly in the sealing chamber.

By the sealing processing described above, the substrate and the opposing substrate become an integrated panel. This panel is transported from the sealing chamber 109 through the transport chamber 101 to the substrate/mask stock chamber 102. Hereinafter, with regard to a next substrate and an opposing substrate, similar processing is carried out. Finally, seven sheets of panels are accommodated into the substrate/mask stock chamber, and the sealing mode is finished. After finishing the sealing mode, a finished panel may be taken out from the substrate/mask stock chamber.

It is possible to carry out a series of processing in the deposition mode and the sealing mode, which is shown above, in a full automatic manner, by utilizing a control system. Concretely speaking, if a recipe, which included information of a transport route/processing content etc., has been registered in advance with respect to each substrate, a series of processing to each substrate is carried out automatically in accordance with this registered recipe by simply sending a sign of processing start.

[Embodiment 2]

In this embodiment, in the light emitting element which was fabricated by the processes shown in the embodiment 1, luminance deterioration was measured on the occasion that constant current drive was carried out.

Figure 2:
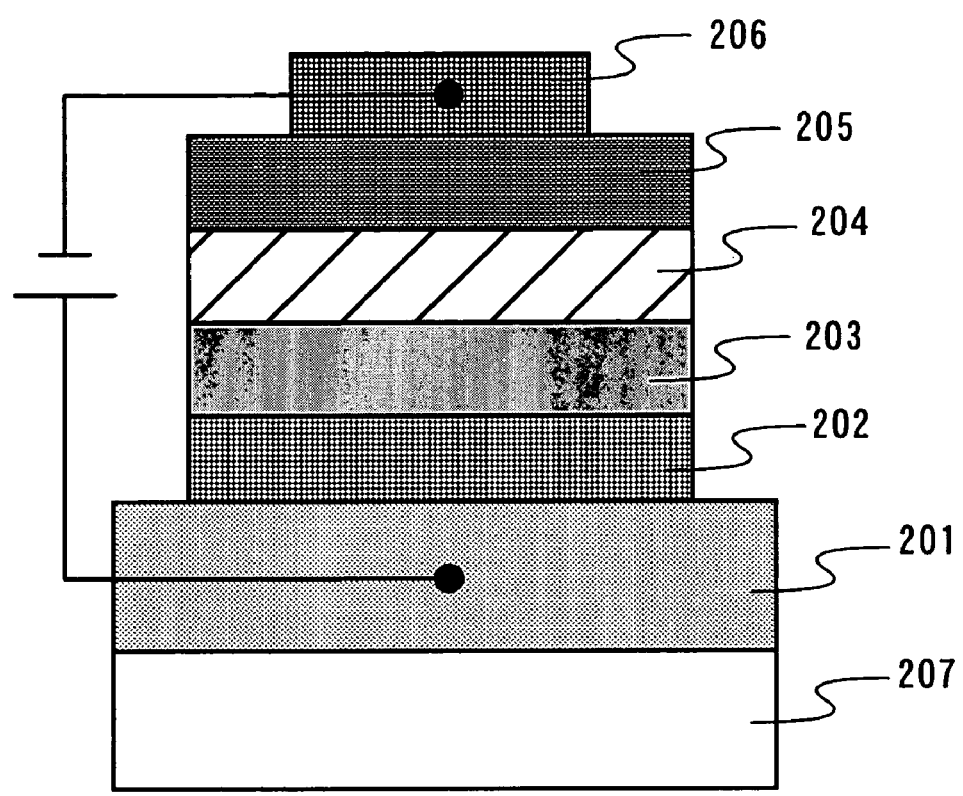
FIG. 2 is a view showing a structure of a light emitting element.

An element structure is shown in FIG. 2. Firstly, after CuPc as a hole injection layer 202 was deposited by 20 nm in vacuum of $10^{-5}$–$10^{-6}$ Pa, to a glass substrate 207 on which a film of ITO of 110 nm was formed as an anode 201, it is exposed for 5 minutes in oxygen gas atmosphere. After that, as a hole transport layer 203, NPB was deposited by 60 nm. As a light emitting layer 204, a co-deposition film of Alq and DMQA was deposited by 37.5 nm. As an electron transport layer 205, Alq was deposited by 37.5 mm. Then, as a cathode 206, $CaF_2$ and Al were deposited by 1 nm and 200 nm, respectively. A mass ratio of Alq and DMQA was 1:0.003. Then, it is glued together with an opposing glass with a dry agent, to which ultraviolet cured resin was applied, and ultraviolet ray was applied, and thereby, sealing was carried out.

Figure 3:
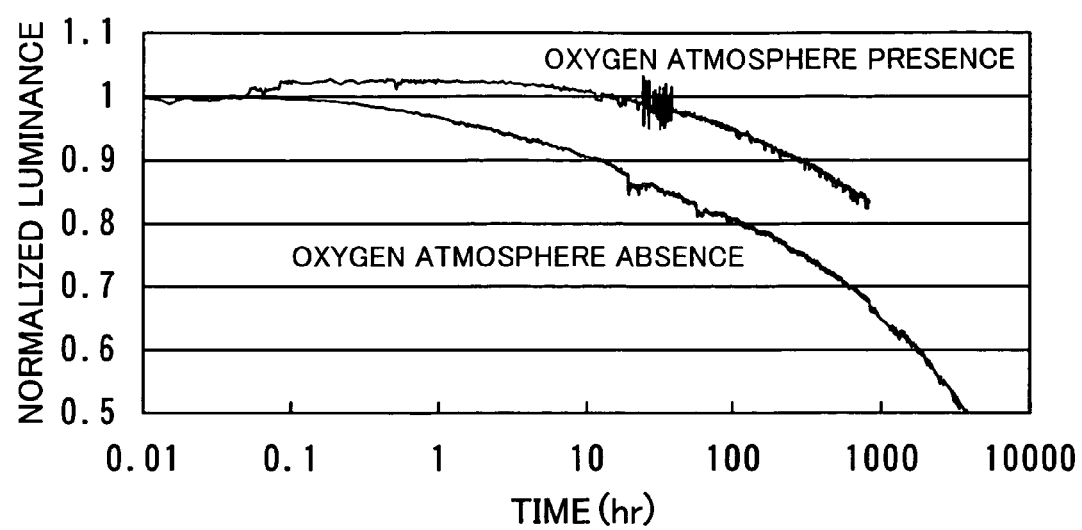
FIG. 3 is a view showing results of an embodiment 2 and a comparative example 1.

By using this element, constant current reliability was carried out at current density 9.2 $mA/m^2$ which corresponds to 1000 $cd/m^2$. A result is shown in a plot "oxygen atmosphere presence" of FIG. 3.

COMPARATIVE EXAMPLE 1

For comparison, in an element which is of the similar element structure to the embodiment 2 and on which NPB was deposited in vacuum-through without being exposed to oxygen atmosphere after CuPc was deposited, initial luminance is set to be the same 1000 cd/m² as the embodiment 2, and a reliability test was carried out on the occasion that constant current drive was carried out (current density 10.2 mA/m²). A result is shown in a plot "oxygen atmosphere absence" of FIG. 3. Comparing both sides, it is understandable that in an element of "oxygen atmosphere presence", initial deterioration is particularly suppressed in constant current drive.

[Embodiment 3]

In this embodiment, by slightly changing an element structure of the embodiment 2, constant current reliability of an element was measured. In the embodiment 2, a mass ratio of a light emitting layer is 1:0.003 between Alq and DMQA, whereas in this embodiment, it is made to be 1:0.01. Other element structures and an element manufacturing method were identical. Initial luminance was 1000 cd/m². Current density which corresponds to this was 13.4 mA/cm². It is shown in "oxygen atmosphere presence".

COMPARATIVE EXAMPLE 2

Figure 4:
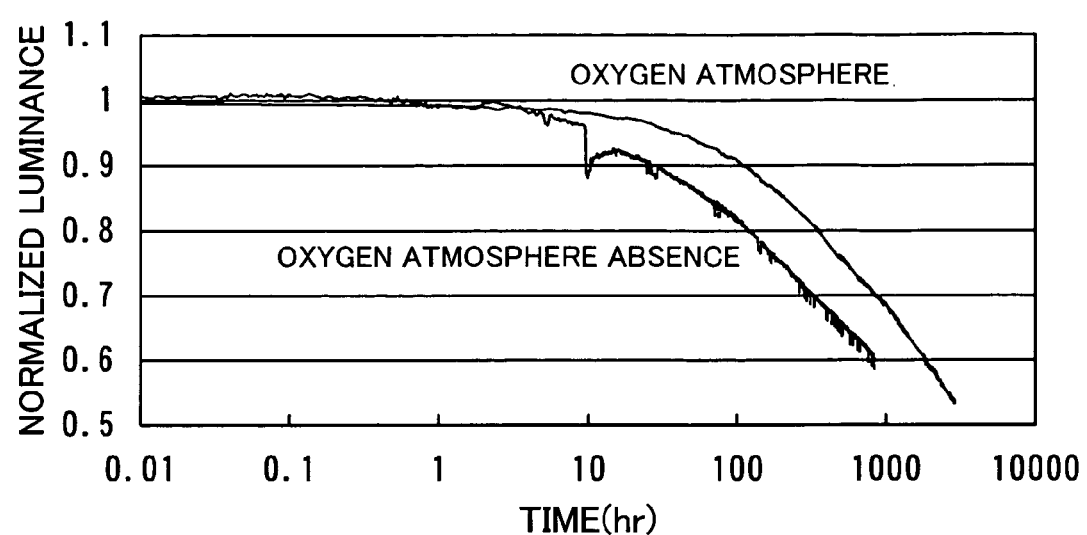
FIG. 4 is a view showing results of an embodiment 3 and a comparative example 2.

For comparison, in an element which is of the similar element structure to the embodiment 3 and on which NPB was deposited in vacuum-through without being exposed to oxygen atmosphere after CuPc was deposited, initial luminance is set to be the same 1000 cd/m² as the embodiment 3, and a reliability test was carried out on the occasion that constant current drive was carried out (current density 15.9 mA/m²). A result is shown in a plot "oxygen atmosphere absence" of FIG. 4. Comparing both sides, it is understandable that in an element of "oxygen atmosphere presence", initial deterioration is particularly suppressed in constant current drive.

[Embodiment 4]

Figure 5A:
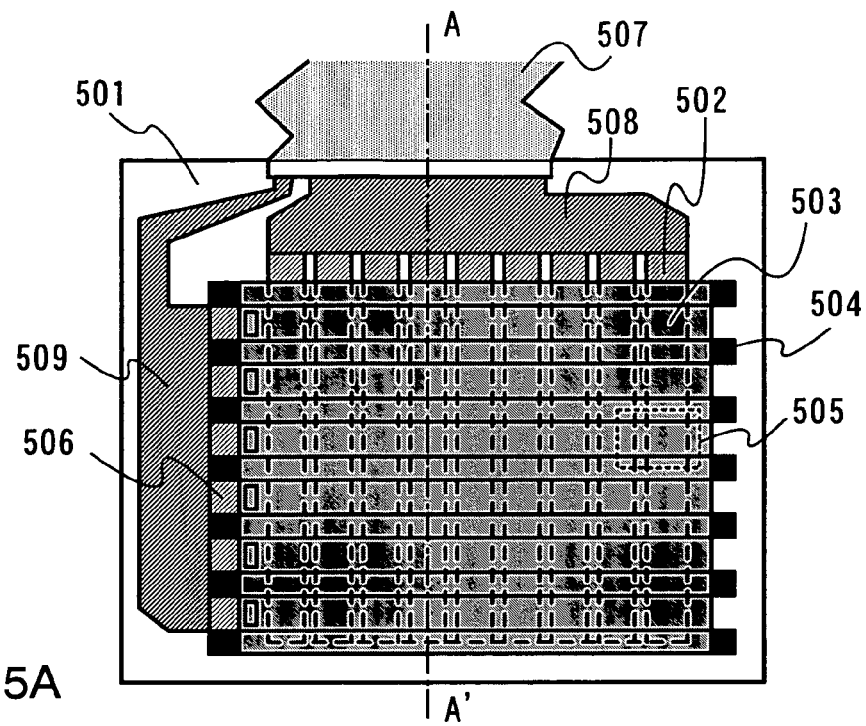
FIG. 5 is a view showing a structure of a light emitting device.

In this embodiment, as an example of a light emitting device which is disclosed in the invention, a passive matrix type light emitting device is illustrated. In FIG. 5A, its top view is shown, and in FIG. 5B, a cross sectional view at the time of cutting with A–A' is shown. As an element of a light emitting element, various modes are possible, and for example, a structure as in the embodiment 2 and the embodiment 3 in this specification may be applicable.

In FIG. 5A, numeral 501 designates a substrate, and a glass material is used. It is possible to use a plastic material, and it is possible to use such a thing that polyimide, polyamide, acrylic resin, epoxy resin, polyether-sulfone (hereinafter, inscribed as "PSE"), polycarbonate (hereinafter, inscribed as "PC", polyethylene terephthalate (hereinafter, inscribed as "PET") or polyether nitryl (hereinafter, inscribed as "PEN") which is made to be of a plate shape, or of a film shape may be the plastic material.

Numeral 502 designates a scanning line (anode) which is composed of an oxide conductive film, and in this embodiment, ITO is used. Also, numeral 503 designates a data line (cathode) which is composed of a metal film, and in this embodiment, $CaF_2$ and Al are laminated. Also, 504 designates a bank which is composed of acrylic resin, and functions as a partition wall for dividing the data lines 503. As to both of the scanning line 502 and the data line 503, a plurality of them are formed in a stripe shape, and disposed so as to be orthogonal to one another. Although it is not shown in FIG. 5A, an organic compound layer is sandwiched between the scanning line 502 and the data line 503, and an intersection part 505 becomes a pixel.

The scanning line 502 and the data line 503 are connected to an external drive circuit through a TAB tape 507. Numeral 508 represents a group of wiring which is composed of the scanning lines 502 which are gathered together, and numeral 509 represents a group of wiring which is composed of aggregation of connection wirings 506 which are connected to the data lines 503. Also, although it is not shown in the figure, in lieu of the TAB tape 507, a TCP that IC is disposed on a TAB tape may be connected.

Figure 5B:
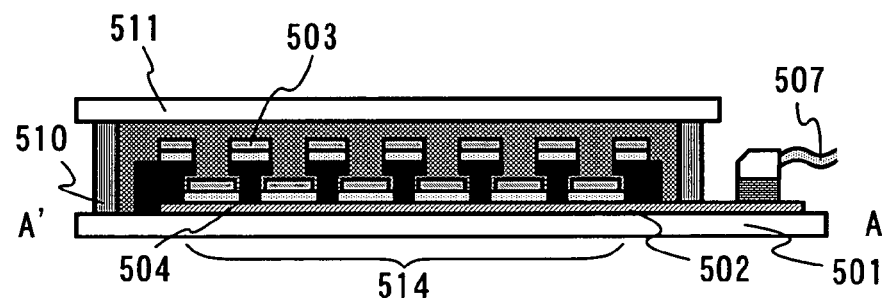

Also, in FIG. 5B, numeral 510 designates a seal member, and numeral 511 designates a cover member which is glued to the substrate 501 by the seal member 510. As the seal member 510, light cured resin may be used, and such a material that degasification is few, and hygroscopicity is low is desirable. As the cover member, the same material as the substrate 501 is preferable, and it is possible to use glass (including quartz glass) or plastic. Here, a glass material is used.

Figure 5C:
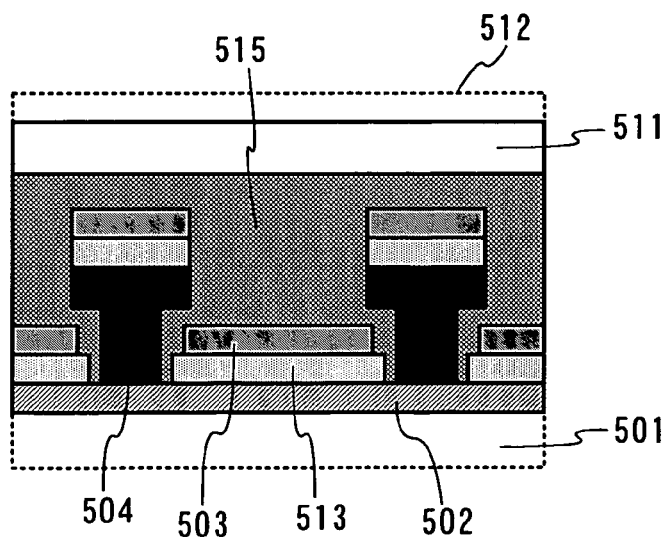

Next, an enlarged view of a structure of a pixel area is shown in FIG. 5C. Numeral 513 designates an organic compound layer. As shown in FIG. 5C, the bank 504 is made to be of such a shape that a width of a lower layer is narrower than a width of a upper layer, and can physically divide the data lines 503. Also, a pixel portion 514, which is surrounded by the seal member 510, is made to be of such a structure that it is shielded from outside air by a sealing member 515 which is composed of resin, and prevents deterioration of an organic compound layer.

A light emitting device of the invention which is composed of a structure as described above can be fabricated by a very simple process, since the pixel portion 514 is formed by the scanning line 502, the data line 503, the bank 504 and the organic compound layer 513.

Also, a polarization plate 512 may be disposed over a display surface (surface for observing an image) of the light emitting device which is shown in this embodiment. This polarization plate has an advantage for suppressing reflection of light which is incident from outside, and for preventing an observer from being reflected on the display surface. In general, a circular polarization plate is used. In this regard, however, in order to prevent light which is emitted from the organic compound layer from being reflected by the polarization plate to be returned to inside, it is preferable to make a structure in which internal reflection is few by adjusting a refraction index.

[Embodiment 5]

Figure 6A:
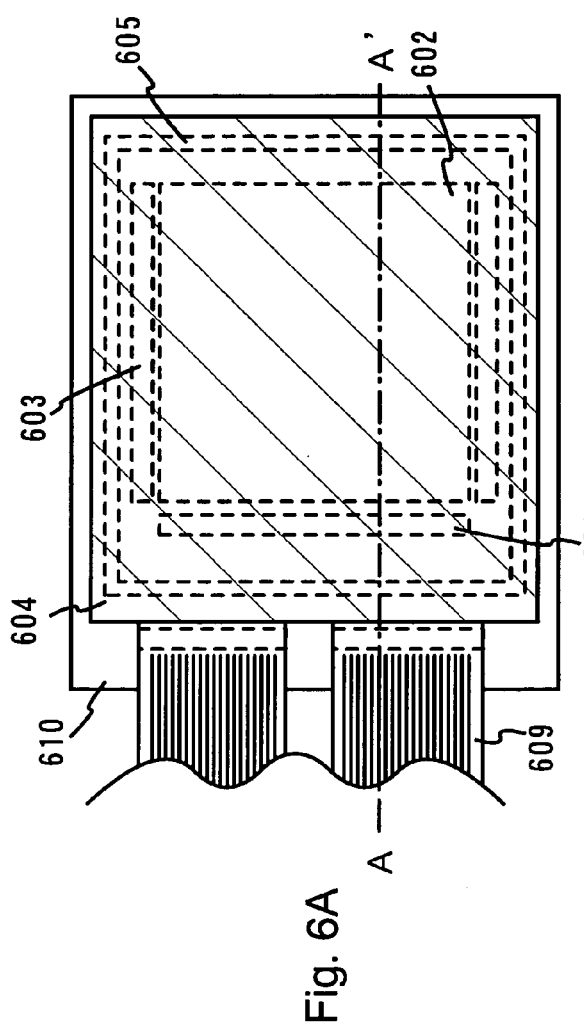
FIG. 6 is a view showing a structure of a light emitting device.
Figure 6B:
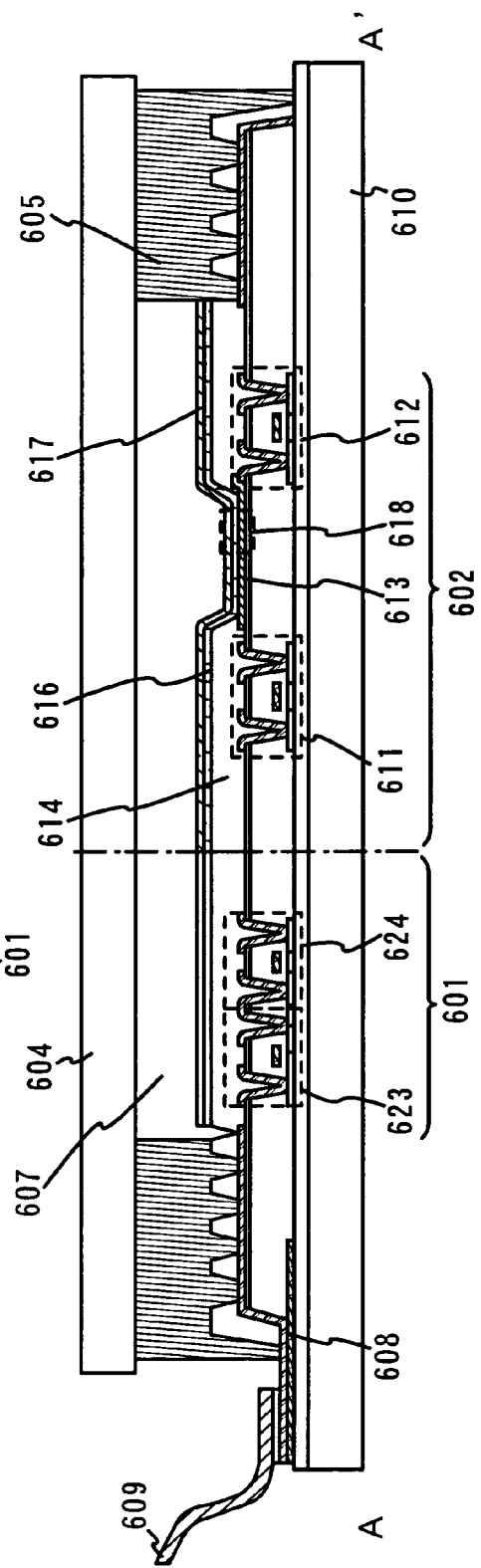

In this embodiment, a light emitting device which has an electric field light emitting element of the invention at a pixel portion, will be described by use of FIGS. 6A, 6B. FIG. 6A is a top view showing the light emitting device, and FIG. 6B is a cross sectional view cutting FIG. 6A with B–B'. Numeral 601 shown by a dotted line designates a drive circuit part (source side drive circuit), numeral 602 designates a pixel portion, and numeral 603 designates a drive circuit part (gate side drive circuit). Also, numeral 604 designates a sealing substrate, and numeral 605 designates a seal agent, and an inside 607 which is surrounded by the seal agent 605 becomes a space.

Numeral 608 designates a wiring for transferring a signal to be inputted to the source side drive circuit 601 and the gate side drive circuit 603, and receives a video signal, a clock signal, a start signal, a reset signal and so on from FPC 609 which becomes an external input terminal. Here, only FPC is shown in the figure, but a printed wiring board (hereinafter, inscribed as "PWB") may be attached to this FPC. It is assumed that the light emitting device in this specification includes not only a light emitting device main body, but also such a state that FPC or PWB is attached to it.

Next, a cross-section structure will be described by use of FIG. 6B. Over a substrate 610, a drive circuit part and a pixel portion are formed, and there, the source side drive circuit 601, which is the drive circuit part, and the pixel portion 602 are shown.

In the source side drive circuit 601, a CMOS circuit is formed in which a n-channel type TFT 623 and a p-channel type TFT 624 are combined. Also, the TFT which forms the drive circuit may be formed by a publicly known CMOS circuit, PMOS circuit, or NMOS circuit. Also shown in this embodiment is a driver integration type in which a drive circuit is formed over a substrate. However, there is no such necessity necessarily, and it can be formed outside, not over a substrate.

Also, the pixel portion 602 is formed by a plurality of pixels which include a switching TFT 611, a current control TFT 612, and a first electrode 613 which is electrically connected to its drain. An insulator 614 is formed so as to cover an end part of the first electrode 613. Here, it is formed by using a positive type photosensitive acrylic resin film.

Also, in order to make coverage better, a curved surface having curvature is formed on a upper end part or a lower end part of the insulator 614. For example, in case that positive type photosensitive acrylic is used as a material of the insulator 614, it is preferable to make only the upper end part of the insulator 614 hold a curved surface having curvature radius (0.2 μm–3 μm). Also, as the insulator 614, it is possible to use each of a negative type which is photosensitive and becomes infusible to etchant by light, or a positive type which becomes fusible to etchant by light.

On the first electrode 613, an electric field light emitting layer 616, and a second electrode 617 are formed, respectively. Here, as a material which is used for the first electrode 613 which functions as an anode, it is desirable to use such a material that a work function is large. For example, besides a single layer film such as an ITO film, an indium zinc oxide film, a titanium nitride film, a chromium film, a tungsten film, a Zn film, and a Pt film, it is also possible to use a lamination layer of titanium nitride and a film which includes aluminum as a major component, and a three layer structure of a titanium nitride film, a film which includes aluminum as a major component and a titanium nitride film, and so on. If a lamination layer structure is used, wiring resistance is low, and good ohmic contact is obtained, it is possible to have it functioned as an anode.

Also, the organic compound layer 616 may use anything if there are at least a light emitting layer and a hole injection layer which used phthalocyanine. For example, a structure as in the embodiment 2 and the embodiment 3 in this specification may be applicable.

Further, as a material which is used for the second electrode (cathode) 617 which is formed on the organic compound layer 616, a material that has a small work function (Al, Ag, Li, Ca, or these alloys MgAg, MgIn, AlLi, $CaF_2$, or CaN) may be used. In case that light, which is generated in the electric field light emitting layer 616, passes through the second electrode 617, it is fine to use a lamination layer of a metal thin film whose film thickness is reduced, and a transparent conductive film (ITO, indium oxide zinc oxide alloy, zinc oxide etc.) as the second electrode (cathode) 617.

Further, it is made to be of such a structure that a light emitting element 618 is provided in a space 607 which is surrounded by the element substrate 601, the sealing substrate 604, and the seal agent 605, by gluing the sealing substrate 614 together with the element substrate 610 by the seal agent 605. Besides such a case that the space 607 is filled with inert gas (nitrogen, argon, etc.), such a structure that it is filled with the seal agent 605 is to be included.

It is preferable to use epoxy series resin for the seal agent 605. Also, it is desirable that these materials be a material which does not transmit moisture and oxygen as much as possible. Also, as a material which is used for the sealing substrate 604, it is possible to use a plastic substrate which comprises polyimide, polyamide, acrylic resin, epoxy resin, PES, PC, PET, PEN, and so on, besides a glass substrate and a quartz substrate.

As described above, it is possible to obtain a light emitting device which has an electric field light emitting element of the invention.

[Embodiment 6]

The light emitting device of the invention, which is described in the above-identified embodiment, has an advantage in that life is long. Therefore, an electronic equipment in which the above-described light emitting device is included as a display part etc. becomes an electronic equipment which lasts for a longer time than in the prior art.

Also, since the above-described light emitting device is of a self-light emission type, there is no necessity of a back light as in a liquid crystal display device. Since a thickness of the organic compound layer is less than 1 μm, it is possible to realize thin shape and lightness in weight. Therefore, an electronic equipment in which the above-described light emitting device is included as a display part etc. becomes an electronic equipment which is of a thinner shape and lighter in weight than in the prior art. This is also extremely useful since it is directly linked to convenience (lightness and compactness on the occasion of carrying about), with regard to an electronic equipment such as, in particular, a portable equipment. Further, also in an entirety of electronic equipment, it is beyond question that to be of a thin shape (not to take up much space) is useful in view of a transport aspect (mass transport is possible), and an installation aspect (securement of a space such as a room etc.).

Since the above-described light emitting device is of a self-light emission type, it has such characteristics that it excels in visibility in a bright place as compared to a liquid crystal display device, and in addition, a viewing field angle is wider. Therefore, there is a big advantage also as to a point of easily viewable display in an electronic equipment which has the above-described light emitting device as a display part.

That is, an electronic equipment which used a light emitting device of the invention, in addition to advantages of a conventional light emitting element such as thin shape and lightness in weight/high visibility, also has a feature of long life, and is extremely useful.

In this embodiment, an electronic equipment which includes a light emitting device of the invention as a display part is illustrated as an example. Applicable examples are shown in FIGS. 7A–7F and FIGS. 8A, 8B. For a light emitting device which is included in an electronic equipment of this embodiment, each of the light emitting device which are disclosed in the invention may be used. For example, the display device which is shown in the embodiment 4 and the embodiment 5 may be used.

Figure 7A:
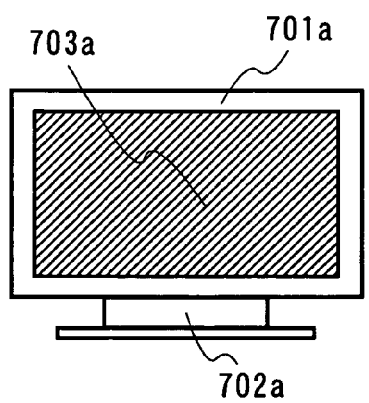
FIG. 7 is a view showing an example of an electronic equipment.

FIG. 7A shows a display device which used a light emitting element, and includes a housing 701a, a support table 702a and a display part 703a. By fabricating a display which used a light emitting device of the invention as the display part 703, it is possible to realize a display which is thin and light in weight, and lasts for a long time. Thus, transport becomes simple, and small space on the occasion of installation becomes possible. In addition, usable life is also long.

Figure 7B:
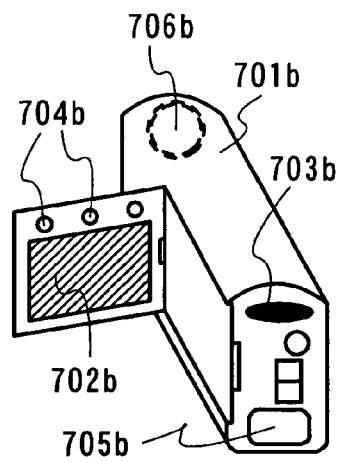

FIG. 7B shows a video camera which includes a main body 701b, a display part 702b, a sound input part 703b, an operation switch 704b, a battery 705b, and an image receiving part 706b. By fabricating a video camera which uses a light emitting device of the invention as the display part 702b, it is possible to realize a video camera which is of long life and weight is reduced.

Figure 7C:
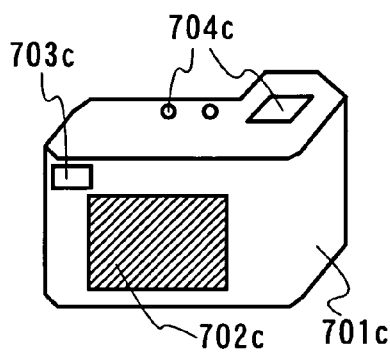

FIG. 7C shows a digital camera which includes a main body 701c, a display part 702c, an eye piece 703c, and an operation switch 704c. By fabricating a digital camera which used a light emitting device of the invention as the display part 703c, it is possible to realize a digital camera which has long life, and is light in weight.

Figure 7D:
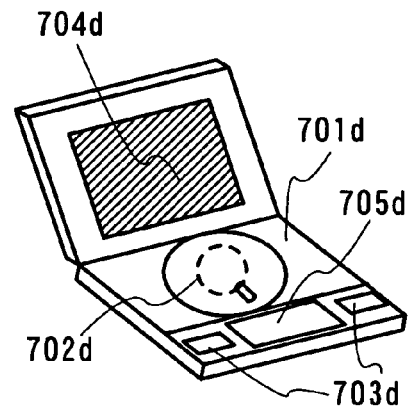

FIG. 7D shows an image reproducing device which is equipped with a recording medium, and includes a main body 701d, a recording medium (CD, LD, or DVD etc.) 702d, an operation switch 703d, a display part(A) 704d, and a display part(B) 705d. The display part(A) 704d mainly displays image information, and the display part(B) 705d mainly displays textual information. By fabricating the above-described image reproducing device which used a light emitting device of the invention as these display part(A) 704d and the display part(B) 705d, it is possible to realize the above-described image reproducing device which lasts for a long time and is light in weight. In this image reproducing device which is equipped with the recording medium, a CD reproducing device, a game equipment and so on are included.

Figure 7E:
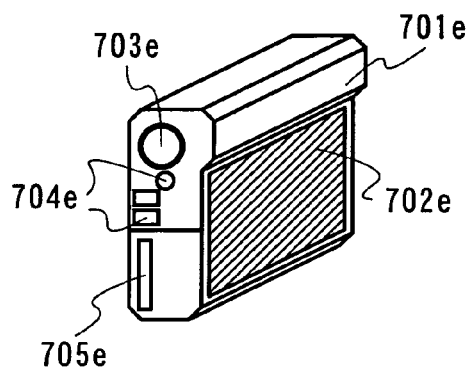

FIG. 7E shows a portable type (mobile) computer which includes a main body 701e, a display part 702e, an image receiving part 703e, an operation switch 704e, and a memory slot 705e. By fabricating a portable type computer which used a light emitting device of the invention as the display part 702e, it is possible to realize a portable type computer which has long life, and is of a thin shape and light in weight. This portable type computer can record and reproduce information in such a recording medium as a flash memory and an integrated non-volatile memory.

Figure 7F:
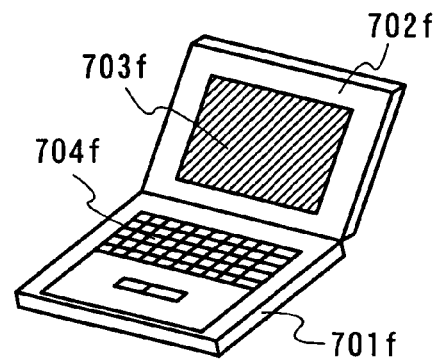

FIG. 7F shows a personal computer which includes a main body 701f, a housing 702f, a display part 703f, and a keyboard 704f. By fabricating a personal computer which uses a light emitting device of the invention as the display part 703f, it is possible to realize a personal computer which has long life, is of a thin shape, and is light in weight. In particular, in case that application to a mobile equipment is necessary as in a notebook personal computer, a point of lightness becomes a big advantage.

The above-described electronic equipment have been receiving many opportunities for displaying information which is distributed through an electronic communication line such as Internet and wireless communication such as electromagnetic waves, and in particular, an opportunity for displaying moving image information has been increased. A response speed of a light emitting element made in accordance with the present invention is very fast, and is suitable for the such moving image display.

Figure 8A:
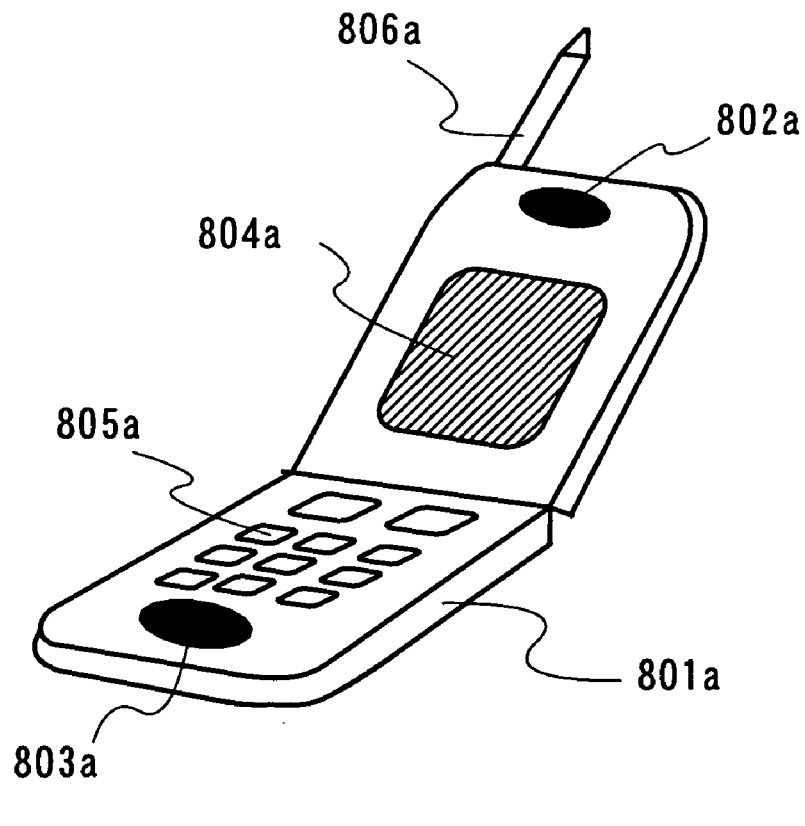
FIG. 8 is a view showing an example of an electronic equipment.

Next, FIG. 8A shows a portable telephone which includes a main body 801a, a sound output part 802a, a sound input part 803a, a display part 804a, an operation switch 805a, and an antenna 806a. By fabricating a portable telephone which uses a light emitting device of the invention as the display part 804a, it is possible to realize a portable telephone which has long life, is of a thin shape, and is light in weight.

Figure 8B:
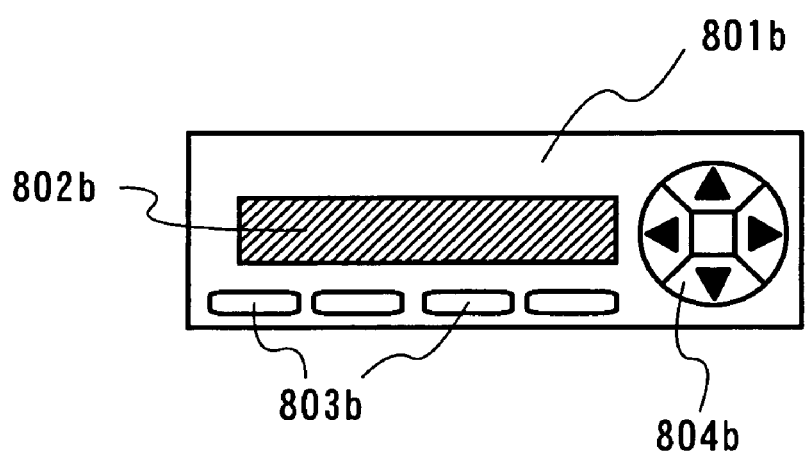

FIG. 8B shows an audio equipment (for example, in-car audio), and includes a main body 801b, a display part 802b, and an operation switches 803b, 804b. By fabricating an audio equipment which uses a light emitting device of the invention as the display part 802b, it is possible to realize an audio equipment which has long life, and is light in weight. Also, in this embodiment, an in-car audio is shown as an example. However, the present invention may be used for a home use audio equipment as well.

In the electronic equipment as shown in FIG. 7A–FIG. 8B, by further embedding a light sensor, and by disposing means for detecting brightness of use environment, it is useful to provide a function so that light emission luminance is modulated in accordance with brightness of use environment. If it is possible to secure brightness of 100–150 by a contrast ratio as compared to brightness of use environment, a user can recognize an image or textual information without problems. That is, it becomes possible to make it easily viewable by increasing luminance of an image in case that use environment is bright, and to suppress electric power consumption by suppressing luminance of an image in case that use environment is dark.

Also, since various electronic equipment which uses a light emitting device of the invention as a light source can be made to have long life and it is possible to realize a thin shape and reduce its weight, it can be said that it is very useful. Representatively, it is an electronic equipment which includes a light emitting device of the invention as a light source such as a back light or a front light of a liquid crystal display device, or as a light source of a lighting equipment.

Therefore, in using liquid crystal displays for all of the display parts of the electronic equipment shown in the embodiments of FIG. 7A–FIG. 8B, and by fabricating an electronic equipment which uses a light emitting device of the invention as a back light or a front light of that liquid crystal display, it is possible to provide electronic equipment which has long life, and in addition, which is thin and light in weight.

The invention claimed is:

1. A manufacturing method of a light emitting device comprising an anode, a cathode, a light emitting layer disposed between said anode and said cathode, and a hole injection layer disposed between said anode and said cathode, the method comprising:
    forming said hole injection layer that comprises phthalocyanine; and
    exposing said hole injection layer to oxygen gas after forming said hole injection layer.

2. The method according to claim 1, wherein said phthalocyanine is copper phthalocyanine.

3. The method according to claim 1, wherein an electron acceptable compound capable of oxidizing phthalocyanine is doped in said hole injection layer.

4. The method according to claim 3, wherein said electron acceptable compound is TCNQ-F4 or $V_2O_5$.

5. The method according to claim 3, wherein said electron acceptable compound is TCNQ-F4 or $V_2O_5$.

6. A manufacturing method of a light emitting device comprising an anode, a cathode, a light emitting layer disposed between said anode and said cathode, and a hole injection layer disposed between said anode and said cathode, the method comprising:
   forming said hole injection layer that comprises phthalocyanine;
   doping an electron acceptable compound capable of oxidizing phthalocyanine into said hole injection layer; and
   exposing said hole injection layer to oxygen gas after forming said hole injection layer.

7. A manufacturing method of a light emitting device comprising an anode, a cathode, a light emitting layer disposed between said anode and said cathode, and a hole injection layer disposed between said anode and said cathode, the method comprising:
   forming said hole injection layer that comprises phthalocyanine in a first chamber of a multi-chamber system; and
   exposing said hole injection layer to oxygen gas in a second chamber of the multi-chamber system after forming said hole injection layer,
   wherein the multi-chamber system has at least the first chamber and the second chamber.

* * * * *